United States Patent [19]

Antipov

[11] 3,899,373

[45] Aug. 12, 1975

[54] METHOD FOR FORMING A FIELD EFFECT DEVICE

[75] Inventor: Igor Antipov, Pleasant Valley, N.Y.

[73] Assignee: International Business Machines Corporation, Armonk, N.Y.

[22] Filed: May 20, 1974

[21] Appl. No.: 471,401

[52] U.S. Cl. .................. 148/187; 29/571; 148/188; 357/23

[51] Int. Cl.$^2$ .................. H01L 21/265

[58] Field of Search ....... 148/186, 187, 1.5; 29/571, 29/578; 357/23

[56] References Cited

UNITED STATES PATENTS

| | | | |
|---|---|---|---|
| 3,479,237 | 11/1969 | Bergh | 148/187 |
| 3,544,399 | 12/1970 | Dill | 148/187 |
| 3,660,735 | 5/1972 | McDougall | 148/1.5 X |
| 3,699,646 | 10/1972 | Vadasz | 148/187 X |
| 3,771,218 | 11/1973 | Langdon | 148/187 X |

OTHER PUBLICATIONS

"Silicon Gate Technology" Vadasz et al., IEEE Spectrum, Vol. 6, No. 10, Oct. 1969, pp. 28–35.

Dhaka et al. Masking Technique, IBM Tech. Disc. Bull., Vol. 11, No. 7, Dec. 1968, p. 864, 865.

*Primary Examiner*—L. Dewayne Rutledge
*Assistant Examiner*—J. Davis
*Attorney, Agent, or Firm*—Wolmar J. Stoffel

[57] ABSTRACT

A method for fabricating an insulated gate field effect transistor device which results in a doped polysilicon gate electrode which gate structure can be used for additional interconnection purposes. The method includes forming a thin blanket layer of an insulating material on a semiconductor substrate having source and drain regions and a surface insulating layer, depositing a blanket layer of polysilicon, depositing a blanket layer of $Si_3N_4$ and selectively removing leaving areas over the gate region and any desired interconnection pattern, oxidizing the exposed areas of the polysilicon layer, removing the remaining areas of $Si_3N_4$, and fabricating a passivation layer and an interconnection metallurgy system on the surface.

11 Claims, 8 Drawing Figures

METHOD FOR FORMING A FIELD EFFECT DEVICE

BACKGROUND OF THE INVENTION

This invention relates to a method of forming integrated circuit devices having embodied therein field effect transistors, more particularly to forming field effect transistors provided with a polysilicon gate electrode.

Field effect transistors are well known in the art and in general are comprised of spaced, diffused source and drain regions embodied in a semiconductor substrate with a conductive field plate overlaid above the gate insulator. In fabricating field effect transistors, a great deal of care must be taken in order to avoid contamination, particularly in forming the gate structure. Still further, in order to obtain a desirable low threshold voltage, the thickness of the gate insulator i.e. the layer of insulation between the semiconductor body overlying the gate region and the gate electrode must be relatively thin. In addition, the quality of the gate insulator must be very high in order to avoid shorting between the gate and the semiconductor. Another necessity is that the contamination in the form of ions in the gate oxide be very low. The aforementioned considerations and factors make forming field effect transistors in the integrated circuit environment requiring increased miniaturization a difficult, precise, and demanding operation.

The use of a doped layer of polysilicon to serve as a conductive gate electrode is known in the art. This broad concept is disclosed in U.S. Pat. No. 3,544,399 and subsequently issued patents. The polysilicon gate structure is capable of withstanding exposure to high temperatures, unlike many conductive metals more conventionally used in semiconductor interconnection metallurgies. A popular use of the polysilicon gate electrode is to define the spacing of the source and drain regions in a semiconductor. In general, the gate structure is fabricated first to subsequently serve as a diffusion mask for forming the source and drain regions. With this technique, potential alignment errors, common to more conventional techniques, are minimized. While there are a number of refractory metals that are capable of withstanding the high temperatures needed for diffusion operations, these metals are difficult to fabricate, in particular, to selectively move in order to form the desired interconnection metallurgy pattern.

The use, however, of a doped polysilicon layer as a gate electrode and also as a metallurgy layer in field effect devices has a number of disadvantages. The surface planarity of the resultant device so necessary to the overlying conductive metallurgy system, cannot be achieved to the desired degree. The polysilicon layer, after selective removal of areas to define the desired pattern, presents on the irregular top surface. Metal stripes that are subsequently deposited over the layer, even though covered by a passivating layer, have a thinned down portion over the step down. Still further, when the polysilicon region is used as a diffusion masking layer in order to form the source and drain regions, the subsequent use as an interconnection pattern is severely limited. For example, the polysilicon metallurgy pattern cannot be extended over the source and drain regions since these areas are open at the time the polysilicon layer is formed. Still further, the doping of the polysilicon gate electrode as well as any associated interconnection structure is normally accomplished during the diffusion of the source and drain regions. Consequently, the same dopant used to form the drain and source is also used to make the silicon conductive. This severely limits the choice of conductive dopants.

Prior to applicant's invention, the processes utilizing a conductive polysilicon layer as a part of the metallurgy were not completely satisfactory, considering the extreme and demanding requirements necessary to form integrated circuit field effect transistors.

SUMMARY OF THE INVENTION

An object of this invention is to provide a novel, improved process for forming field effect transistors provided with a polysilicon conductive gate.

Another object of this invention is to provide a process utilizing a conductive polysilicon layer as a gate electrode which results in improved planarity, greater freedom in designing the interconnection metallurgy pattern, and a reduction in the number of and complexity of the process steps.

Yet another object of this invention is to provide an improved process for forming insulated gate field effect transistors utilizing a doped polysilicon gate electrode.

These and other objects and advantages of the invention are achieved by the subject method of the invention wherein a semiconductor substrate having source and drain regions and a field oxide layer and a gate dielectric layer over at least the gate region is provided, depositing a blanket layer of silicon over the field oxide layer, depositing a blanket layer of $Si_3N_4$ over the silicon layer, removing by photolithographic techniques areas of the $Si_3N_4$ leaving at least the gate region, oxidizing the exposed areas of the silicon layer in their entirety forming a layer of thermal $SiO_2$, removing the remaining areas of $Si_3N_4$, and forming a passivating layer and an interconnection metallurgy layer on the surface of the device.

BRIEF DESCRIPTION OF THE DRAWINGS

The invention will be described in greater detail by reference to the drawings in which.

DESCRIPTION OF THE PREFERRED EMBODIMENTS

Figure 1:
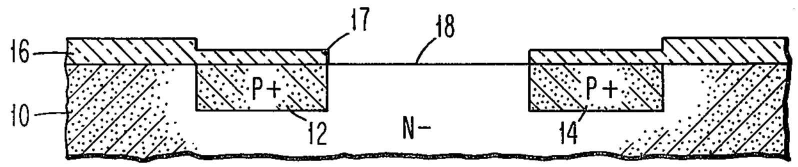
FIGS. 1–7 is a sequence of elevational views in broken section that illustrate a preferred embodiment of the method of the invention.

Referring now to the figures of the drawing, there is illustrated in FIG. 1 a typical starting structure for practicing the method of the invention. The structure includes a monocrystalline semiconductor substrate 10 embodying a first type dopant for semiconductor materials having disposed therein source regions 12 and drain regions 14, and a field insulating layer 16. Source and drain regions 12 and 14 can be formed by any suitable technique, as for example, diffusion or ion implantation. It should be understood that the structure illustrated in FIG. 1 is representative. The method of the invention could be practiced on integrated circuit devices that include other active and passive elements. Further, it could be utilized in producing complementary field effect devices utilizing a combination of n and p channel transistors. In this instant, a pocket containing a semiconductor dopant opposite to the background doping of substrate 10 is formed. The field oxide region 16 is normally relatively thick in order to provide sufficient spacing between the interconnection metallurgy and the underlying substrate in the final structure. Alternatively, the starting structure could consist of substrate 10 without the field insulation layer. When the field insulation layer 16 is provided, an opening 17 is made to open up the gate region 18, as shown in FIG. 1.

Figure 2:
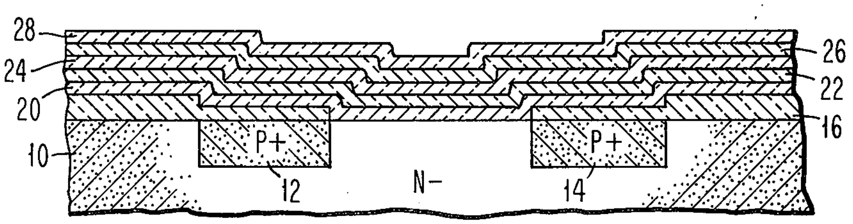

As illustrated in FIG. 2, the gate dielectric layer 20 is then deposited on the surface of the starting structure in direct contact with the gate region 18. When no field insulation layer is provided, the entire layer 20 is deposited directly on the surface of substrate 10. In general, the thickness of the gate dielectric layer 20 is relatively thin in order to provide desirable low threshold voltages. The preferred thickness is at least 300 Angstroms although the thickness could be as low as 100 Angstroms, depending on the quality of the gate dielectric layer 20. The upper thickness limit is determined by the desired device threshold voltage and operating response considerations, normally on the order of 700 Angstroms. Layer 20 is thus formed of any material capable of meeting the demanding requirements of the gate dielectric, including thermally or pyrolytically deposited silicon oxide, or other materials. A preferred gate dielectric is formed by depositing a thin layer of $SiO_2$ by chemical vapor deposition techniques, having a thickness on the order of 300 Angstroms and subsequently exposing the device of an oxidizing atmosphere to form an additional layer of thermal $SiO_2$ at the interface of the originally deposited layer and the substrate 10, when substrate 10 is formed of silicon. A blanket layer 22 of silicon is then deposited on layer 20 as shown in FIG. 2. Layer 22 is any suitable thickness, preferably in the range of 1,000 to 4,000 Angstroms, more particularly in the range of 2,000 to 3,000 Angstroms. The thickness of layer 22 is such that planarity will be achieved as will be explained later. Layer 22 is deposited by chemical vapor deposition techniques, known in the art, wherein typically a silicon gas, i.e., $SiH_4$, $SiCl_4$, and a reducing agent such as $H_2$ is carried through a reaction chamber on an inert carrier gas and over the substrate 10 which is heated to a temperature in the range of 600° to 800°C. The reaction takes place at the heated surface wherein silicon is reduced and deposited. A dopant for semiconductor materials can be added to the gas stream or can be subsequently introduced into the silicon, as will be apparent from the description that follows. Unlike processes wherein the polysilicon gate is used to define the spacing between the source and drain, the dopant embodied in the silicon layer 22 need not be the same dopant as used to form the source and drain regions. Arsenic is the preferred dopant present in an amount to produce the desired conductivity. A blanket layer 24 of $SiO_2$ is then formed on the surface of layer 22. Layer 24 can be formed by oxidizing the layer 22 or by chemical vapor deposition techniques. The layer 24 is normally very thin in the range of 100 to 300 Angstroms and prevents the subsequent $Si_3N_4$ layer 26 from being deposited directly on layer 22. If desired, layer 24 can be deleted. As shown in FIG. 2, a blanket layer 26 of $Si_3N_4$ is then deposited over the surface of layer 22 or layer 24, if layer 24 is provided. Layer 26 serves as an oxidation mask, which will be more apparent from the description that follows, and therefore must have a thickness sufficient to withstand the oxidation of the layer 22. Layer 26 will normally have a thickness on the order of 500 Angstroms. A subsequent blanket layer 28 of $SiO_2$ is then formed on the surface of $Si_3N_4$ layer 26. Layer 28 will serve as an etchant mask for the underlying $Si_3N_4$. Resist layer, not shown, is then deposited on the surface of layer 28, exposed, developed in the state necessary to delineate the gate electrode and any desired additional metallurgy configurations. The technique for etching silicon nitride with an overlying silicon oxide layer is described in U.S. Pat. No. 3,479,237.

Figure 3:
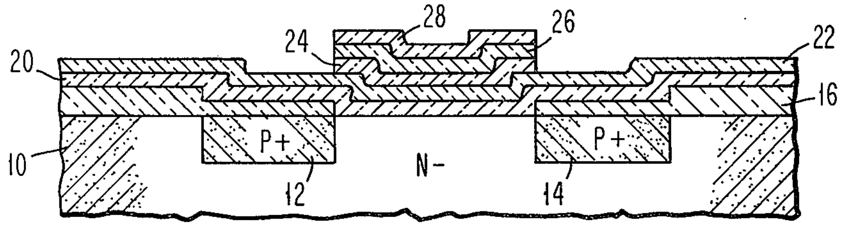
Figure 8:
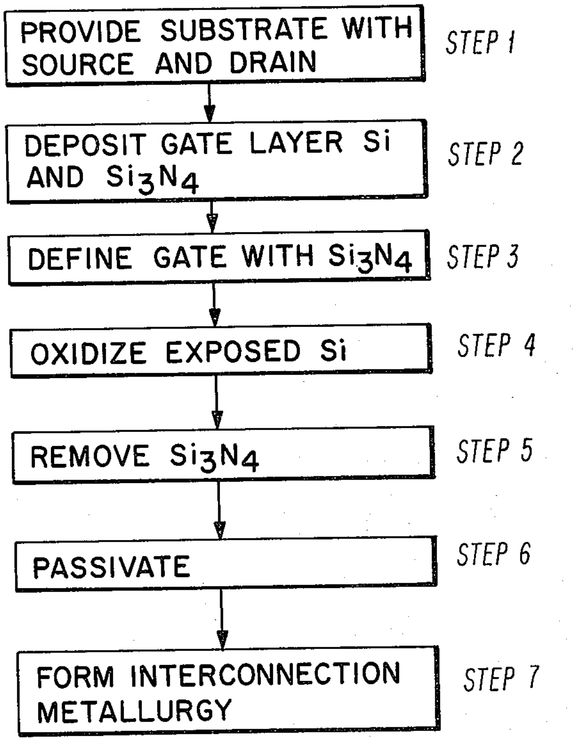
FIG. 8 is a process flow diagram showing the steps of fabricating a field effect transistor device in accordance with the method of the invention.

As shown in FIG. 3 and described in Step 3 of FIG. 8, layers 24, 26 and 28 are selectively removed by etching leaving areas that define at least the gate electrode of the field effect transistor. In addition to the gate electrode configuration, additional metallurgy interconnections can be defined at this point. As is believed apparent, the interconnections so formed can pass over the source and drain regions 12 and 14 providing great freedom in their design thereof.

Figure 4:
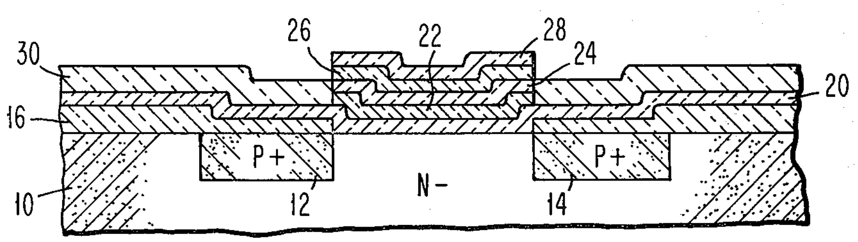

As shown in FIG. 4, the resultant exposed areas of silicon layer 22 are oxidized in their entirety to form a thicker layer 30 of $SiO_2$. The combination of layers 16, 20 and 30 in the field regions of the device provides a relatively thick layer of insulating material sufficient to space the subsequent metallurgy layer from the substrate 10. In the event that field insulation layer 16 is not initially provided on the surface of device 10, the thickness of the silicon layer 22 can be increased thereby providing a relatively thicker layer over the field regions of the device. Layer 22 can be oxidized by exposing the device to a heated steam environment for a time sufficient to oxidize the entire region.

Figure 5:
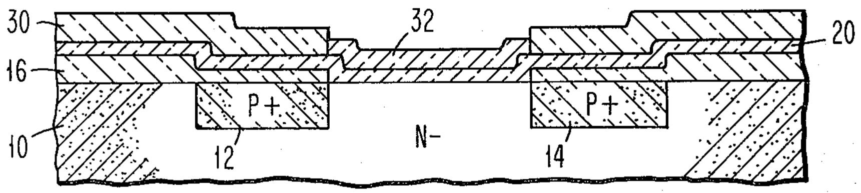

As shown in FIG. 5, the remaining portions of layers 28, 26 and 24 over the gate region and also in the interconnection metallurgy are then removed by dip etching the structure. In removing layers 24 and 28, a thin top surface layer may be removed from layer 30 but this is permissible. A dopant is then introduced into the silicon gate 32, as well as any other metallurgy stripes, by diffusion or ion implantation. This does not require any masking. The preferred dopant for gate 32 is arsenic sufficient to obtain the desired resistivity, typically 75 ohms/square which can be achieved by the concentration of arsenic in the range of $10^{19}$ to $10^{21}$ atoms/cc. This dopant introduction step is not necessary if the dopant were introduced earlier in the process as the layer 22 was deposited.

Figure 6:
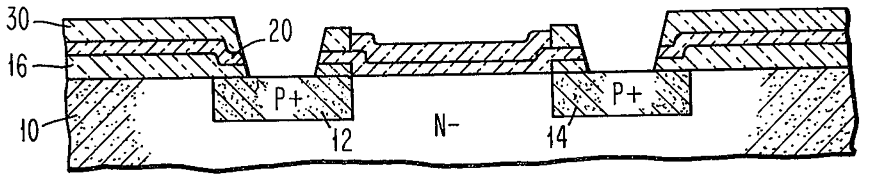
Figure 7:
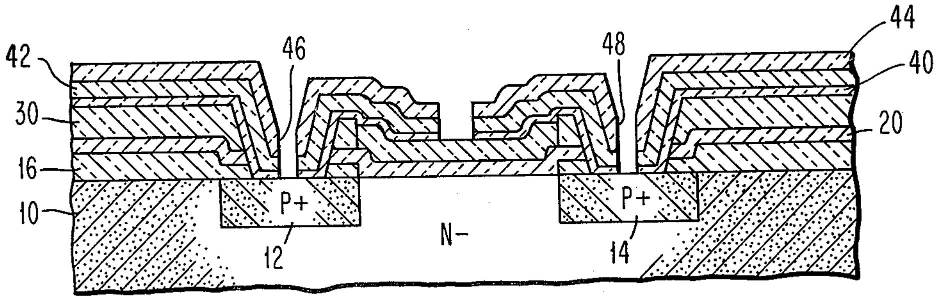

As shown in FIG. 6, oversized contact holes 34 and 36 are made to source and drain regions 12 and 14 through layers 16, 20 and 30. This operation is accomplished using conventional photolithographic and subtractive etching techniques. A passivating structure is then formed on the surface of the device as shown in FIG. 7 and described in Step 6 of FIG. 8. Any suitable type of passivation can be utilized. A typical preferred passivation consists of a first thin layer 40 of pyrolytically deposited $SiO_2$, and overlying layer 42 of $Si_3N_4$, and an overlying thick layer of $SiO_2$ formed by chemical vapor deposition techniques. Contact openings 46, 48 and 49 are then etched through the composite layers 40, 42 and 44 to expose the source and drain regions 12 and 14 and contact 49 to gates and silicon interconnections.

The aforedescribed method has a number of advantages not present in comparable prior art methods of fabricating field effect transistors having a conductive polysilicon gate layer and associated metallurgy. In this process unlike known processes where the gate structure is used to define the source and drain regions acting as a diffusion mask, the metallurgy stripe and gate electrodes can pass directly over the source and drain regions. This provides an important greater latitude in designing the metallurgy structure. Another advantage is that any suitable type of dopant can be provided in the gate electrode since the choice is not restricted to the same dopant used to form the source and drain regions. This is particularly important when the process is used to form complementary field effect transistors. Further, the use of arsenic as a dopant for polysilicon gate structures and metallurgy allows the removal of the nitride from the gates. This eliminates the instability associated with double level insulators in the gate, i.e., the threshold voltage shift. Another advantage is that the polysilicon gates are defined by a thick abutting oxide layer i.e., layer 30. This is believed to alleviate gate shorts when the polysilicon edge is defined over thin gate oxide. A further advantage is that the top surface planarity is improved since there is no step down about the gate and metallurgy of the conductive polysilicon structure. Layer 30 of $SiO_2$ abuts the gate structure 32.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for fabricating an insulated gate field effect transistor device comprising a. providing a semiconductor substrate of a first conductivity type having at least source and drain regions of a second opposite conductivity type, and a field layer of insulating material on the surface having at least the gate area open between the source and drain regions, b. forming a first thin blanket layer of an insulating material having a thickness of at least 100 Angstroms on the surface of said substrate, c. depositing a second blanket layer of silicon material over said layer of insulating material, d. depositing a third blanket layer of $Si_3N_4$ and a fourth blanket layer of $SiO_2$ over said silicon layer, e. removing by photolithographic techniques areas of said third and fourth blanket layers of $Si_3N_4$ and $SiO_2$ over the field regions leaving areas at least over the gate regions, f. oxidizing the exposed areas of said third silicon layer in their entirety forming a layer of thermal $SiO_2$, g. removing the remaining areas of $SiO_2$ and underlying $Si_3N_4$ thereby uncovering the gate electrode, h. depositing a fifth blanket passivating layer of an insulating material on the surface of the resultant device, i. forming contact openings to at least said source and drain regions, and j. forming an interconnection metallurgy system.

2. The method of claim 1 wherein said first blanket layer of insulating material is a layer of $SiO_2$ formed by chemically vapor depositing $SiO_2$ and subsequently exposing the resultant layer to an oxidizing environment resulting in a thickness in the range of 100 to 700 Angstroms.

3. The method of claim 1 wherein said second blanket layer of silicon has incorporated therein a dopant for semiconductor materials as it is deposited.

4. The method of claim 3 wherein said dopant in said second blanket layer is As in a concentration in the range of $10^{19}$ to $10^{21}$ atoms/cc.

5. The method of claim 1 wherein a dopant for semiconductor materials is introduced into said second layer of silicon following the removal of said remaining areas of $SiO_2$ and underlying $Si_3N_4$.

6. The method of claim 5 wherein said dopant for semiconductor materials is As.

7. The method of claim 1 wherein said semiconductor substrate initially included a relatively thick layer of insulating material disposed over the field regions.

8. The method of claim 1 wherein portions of said third and fourth layers are retained prior to oxidizing the exposed areas of said second silicon layer to define a conductive lead to the gate electrode.

9. The method of claim 1 wherein a thin layer of thermal $SiO_2$ is formed on said second blanket layer of silicon prior to forming said third and fourth layers, said thin layer of thermal $SiO_2$ formed by exposing said second layer to an oxidizing atmosphere.

10. The method of claim 9 wherein said thermal $SiO_2$ layer has a thickness in the range of 100 to 300 Angstroms.

11. A method for fabricating an insulated gate field effect transistor device comprising a. providing a semiconductor substrate of a first conductivity type having at least source and drain regions of a second opposite conductivity type, and a layer of insulating material on the surface, b. depositing a second blanket layer of silicon material over said layer of insulating material, c. depositing a third blanket layer of $Si_3N_4$ and a fourth blanket layer of $SiO_2$ over said silicon layer, d. removing by photolithographic techniques areas of said third and fourth blanket layers of $Si_3N_4$ and $SiO_2$ over the field regions leaving areas at least over the gate regions, e. oxidizing the exposed areas of said third silicon layer in their entirety forming a layer of thermal $SiO_2$, f. removing the remaining areas of $SiO_2$ and underlying $Si_3N_4$ thereby uncovering the gate electrode, g. depositing a fifth blanket passivating layer of an insulating material on the surface of the resultant device, h. forming contact openings to at least said source and drain regions, and i. forming an interconnection metallurgy system.

* * * * *